(12) United States Patent
Chien et al.

(10) Patent No.: US 8,926,762 B2
(45) Date of Patent: Jan. 6, 2015

(54) APPARATUS AND METHODS FOR MOVABLE MEGASONIC WAFER PROBE

(75) Inventors: Ying-Hsueh Chang Chien, New Taipei (TW); Shao-Yen Ku, Jhubei (TW); Ming-Hsi Yeh, Hsinchun (TW); Chi-Ming Yang, Hsin-Chu (TW); Chin-Hsiang Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 268 days.

(21) Appl. No.: 13/226,216

(22) Filed: Sep. 6, 2011

(65) Prior Publication Data

US 2013/0056031 A1    Mar. 7, 2013

(51) Int. Cl.
*B08B 3/04* (2006.01)
*B08B 3/12* (2006.01)

(52) U.S. Cl.
CPC ........................................ *B08B 3/12* (2013.01)
USPC ..................... 134/21; 134/1; 134/1.3; 134/34

(58) Field of Classification Search
None
See application file for complete search history.

(56) References Cited

U.S. PATENT DOCUMENTS

| 2003/0230323 | A1* | 12/2003 | You et al. ......................... 134/33 |
| 2004/0069319 | A1* | 4/2004 | Boyd et al. ..................... 134/1.3 |
| 2008/0273181 | A1 | 11/2008 | De Jong et al. |
| 2011/0297182 | A1* | 12/2011 | Choi et al. ........................ 134/1 |

FOREIGN PATENT DOCUMENTS

| KR | 1020050017925 A | 2/2005 |
| KR | 20100039311 A | 4/2010 |
| KR | 20110079830 A | 7/2011 |
| WO | WO 2010-096041 A1 | 8/2010 |

* cited by examiner

*Primary Examiner* — Nicole Blan
*Assistant Examiner* — Ryan Coleman
(74) *Attorney, Agent, or Firm* — Slater & Matsil, L.L.P.

(57) ABSTRACT

Methods and apparatus for a movable megasonic wafer probe. A method is disclosed including positioning a movable probe on a wafer surface, the movable probe having an open bottom portion that exposes a portion of the wafer surface; applying a liquid onto the wafer surface through a bottom portion of the movable probe; and moving the movable probe at a predetermined scan speed to traverse the wafer surface, applying the liquid to the wafer surface while moving over the wafer surface. In additional embodiments the method includes providing a transducer for applying megasonic energy to the wafer surface. Apparatus embodiments are disclosed including the movable megasonic wafer probe.

20 Claims, 5 Drawing Sheets

APPARATUS AND METHODS FOR MOVABLE MEGASONIC WAFER PROBE

BACKGROUND

A common requirement in current advanced semiconductor processing is for wafer rinse and clean processes. Wafer rinse or clean is performed at various stages in the processing and may remove particles or residues left by a prior process. For example, patterned films such as dielectric layers may be cleaned to remove particles. While in past generations of semiconductor tools, a batch rinse station might be used which applied de-ionized water ("DIW") or other cleaners to a number of wafers arranged in a boat or carrier by spray or immersion techniques, more recently single wafer cleaning stations have been used. As wafer sizes increase to the current 300 millimeter ("12 inch") and the coming 450 millimeter ("18 inch") sizes, the use of single wafer tools is becoming even more prevalent.

In the current single wafer cleaning tools, a wafer may be mounted on a platen or chuck with its active face oriented upwards, for example, and a spray nozzle may apply deionized water ("DIW") or other cleaning solutions or solvents under pressure. The spray nozzle may travel across the wafer. For example if the wafer is rotating about a central axis, the nozzle may travel rectilinearly across half or all of the wafer to enable the nozzle to spray the entire wafer surface. The speed the nozzle travels relative to the wafer surface is the nozzle "scan speed". However, the use of pressure provided, for example, by aerosol and DIW sprayed on a wafer surface by a moving spray nozzle can damage wafers. In some systems, the nozzle pressure can be controlled and raised and lowered. However, even when low pressure is used, "outlier" droplets from the spray nozzle can still impact the wafer surface at greater velocity than desired, which may cause pattern damage. These fast moving outlier droplets can transfer their kinetic energy to a loose particle, which as it travels away from the wafer surface, may collide with a portion of the pattern and damage the pattern. A lower nozzle spray pressure may be used to avoid the damage, but this lowered pressure results in lowered particle removal efficiency. That is, a tradeoff exists in conventional wafer cleaning tools between the velocity or nozzle pressure of the spray DIW, and the particle removal efficiency ("PRE") obtained.

A continuing need thus exists for methods and apparatus for cleaning wafers with high particle removal efficiency and without the disadvantages currently experienced using known methods.

BRIEF DESCRIPTION OF THE FIGURES

For a more complete understanding of the present invention, and the advantages thereof, reference is now made to the following descriptions taken in conjunction with the accompanying drawings, in which.

The drawings, schematics and diagrams are illustrative and not intended to be limiting, but are examples of embodiments of the invention, are simplified for explanatory purposes, and are not drawn to scale.

DETAILED DESCRIPTION

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present application which are now described in detail provide novel methods and apparatus for providing a wafer cleaning system including providing a movable megasonic cleaning probe. The movable megasonic cleaning probe is smaller in area than the wafer and may travel around or across the wafer and thus "scan" the front side of a wafer. The movable cleaning probe uses sonic energy such as megasonic energy in addition to applying DIW or other cleaners or chemicals to remove particles. In some embodiments, the apparatus may also include a backside cleaning process that operates to clean the backside of the wafer simultaneously during the front side wafer processing. In some embodiments, the movable cleaning probe includes a port for applying the fluid, and further provides fluid circulation so that particles that are dislodged are immediately removed from the surface of the wafer; thereby preventing recontamination issues. By utilizing a movable immersion hood approach, the embodiment movable probe may apply process chemicals to a wafer surface, replacing spray hoods and other known methods.

To achieve an efficient particle removal without damaging the delicate structures formed on the wafer, the cleaning process needs to control the scan speed (and if used, wafer rotation speed) precisely. Further the particles loosened, for example by megasonic energy, need to be efficiently removed to prevent these particles from re-depositing on the wafer. Accurate control of the scan speed and scan coverage pattern is important because the particle removal efficiency obtained needs to be as high as possible but without causing damage to the structures on the surface of the wafer.

Figure 1:
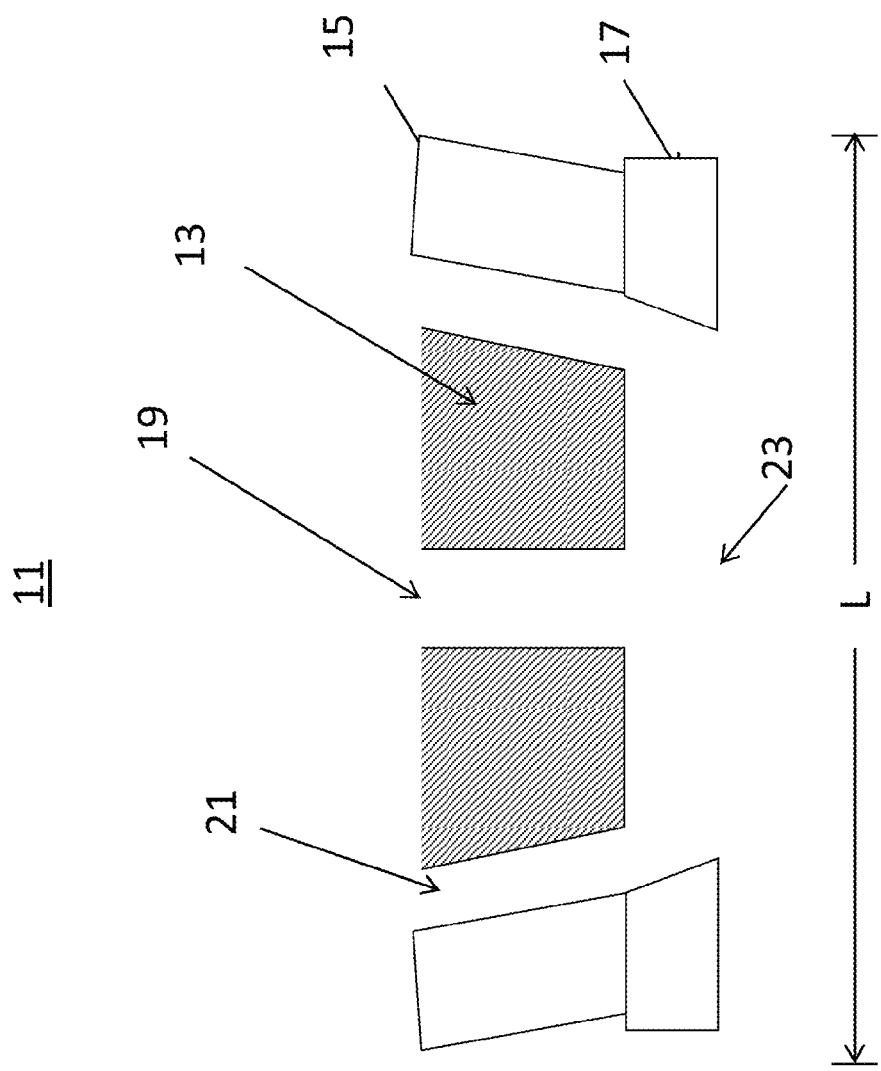
FIG. 1 depicts in a cross-sectional view an embodiment.

FIG. 1 depicts in a cross-sectional view an example embodiment of the movable megasonic probe 11. A transducer 13 is arranged in a central portion of a body of immersion hood 15. Transducer 13 has an opening forming an input port 19 in a central portion and is spaced from the inner walls of the body of the immersion hood 15 by additional port or ports 21. A bottom portion 17 of the immersion hood provides a foot or buffer for contacting the wafer surface. The movable megasonic probe 11 has a length "L". The probe may be a couple of inches in length and width, or the length and/or width may be increased up to several inches or more; typically, it is sized to cover a convenient portion of the surface of a semiconductor wafer at the bottom opening 23. As wafer sizes are now approaching 450 millimeters or 18 inches in diameter, the movable probe can be several inches long and still cover only a portion of the wafer at a time. The bottom opening 23 will be placed over the semiconductor wafer and the wafer surface will form with the bottom portions 17, and the body of the immersion hood 15, and a fluid recirculation path, as is described further below.

FIG. 1 is a cross-sectional view. The movable probe 11 may be, for example, round or circular in shape; rectangular, octagonal, square, or other shape as desired. The materials should be durable materials such as are used in tools for semiconductor processing. The transducer may be made of a metal such as aluminum; a variety of alternative materials may be used. Also these same materials may be used with immersion hood 15 and bottom portion 17; in addition to aluminum, other durable metals and compounds could be used, such as stainless steel. Coatings such as Teflon may be added to protect the materials in probe 11 from the chemicals used in semiconductor processing.

Figure 2:
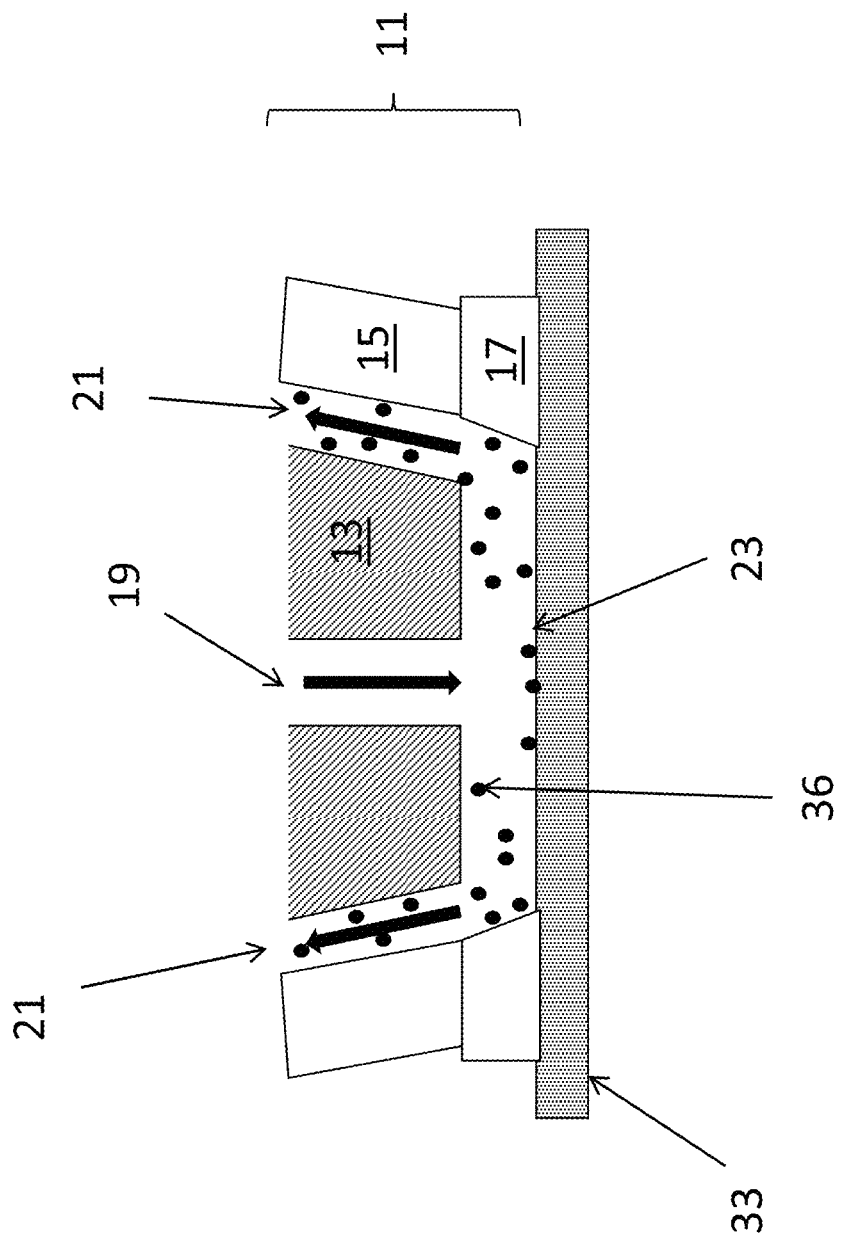
FIG. 2 depicts in a cross-sectional view the embodiment of FIG. 1 in use in an embodiment method.

FIG. 2 depicts in a cross-sectional view the operation of the movable probe 11 disposed over a portion of a semiconductor wafer 33. The transducer 13 is shown with the fluid flow indicated into the transducer. The input port 19 receives the fluid and it is forcibly applied through input port 19 to a central portion of the bottom opening 23. The wafer surface closes the immersion hood formed by 17 and 15, and the fluid and the particles picked up by the fluid circulate radially outward from the central portion of the transducer. The fluid exits the movable megasonic probe 11 through the exhaust ports 21.

During processing, the transducer applies sonic energy which, as is known, loosens particles from a film or surface on a semiconductor wafer. The wafer and wafer surface may be silicon or gallium arsenide, or an oxide or dielectric layer or passivation layer formed on the wafer, or a metal or conductor layer formed on the wafer. DIW may be applied as a rinse or cleaner. Other fluids may be used including dilute ammonia hydroxide hydrogen peroxide water mixture, or "dAPM", sometimes known as "SC1". Solvents may be used, also gasses may be bubbled into solution such as N2, NH3, H2, O3, and the like. Other chemicals such as surfactants may be added to the liquid to improve the cleaning process.

In alternative embodiments, the transducer 13 and immersion hood 15 could be modified so that the liquid flow is reversed. In this alternative embodiment, fluid is input into the outside ports 21 and the liquid flows radially inward to the central port 19 where it is exhausted. In either embodiment, the liquid is provided flowing across the surface of the wafer 33 as the megasonic energy is applied, and the particles loosened are immediately removed.

In operation, the transducer 13 applies sonic energy to loosen the particles 36. As is known, ultrasonic energy could be used, which may lie in the frequency range from 1-20 Mhz, but in these example embodiments, megasonic energy, from 500-1000 kHz range, is used as it tends to be less damaging to delicate structures.

Figure 3:
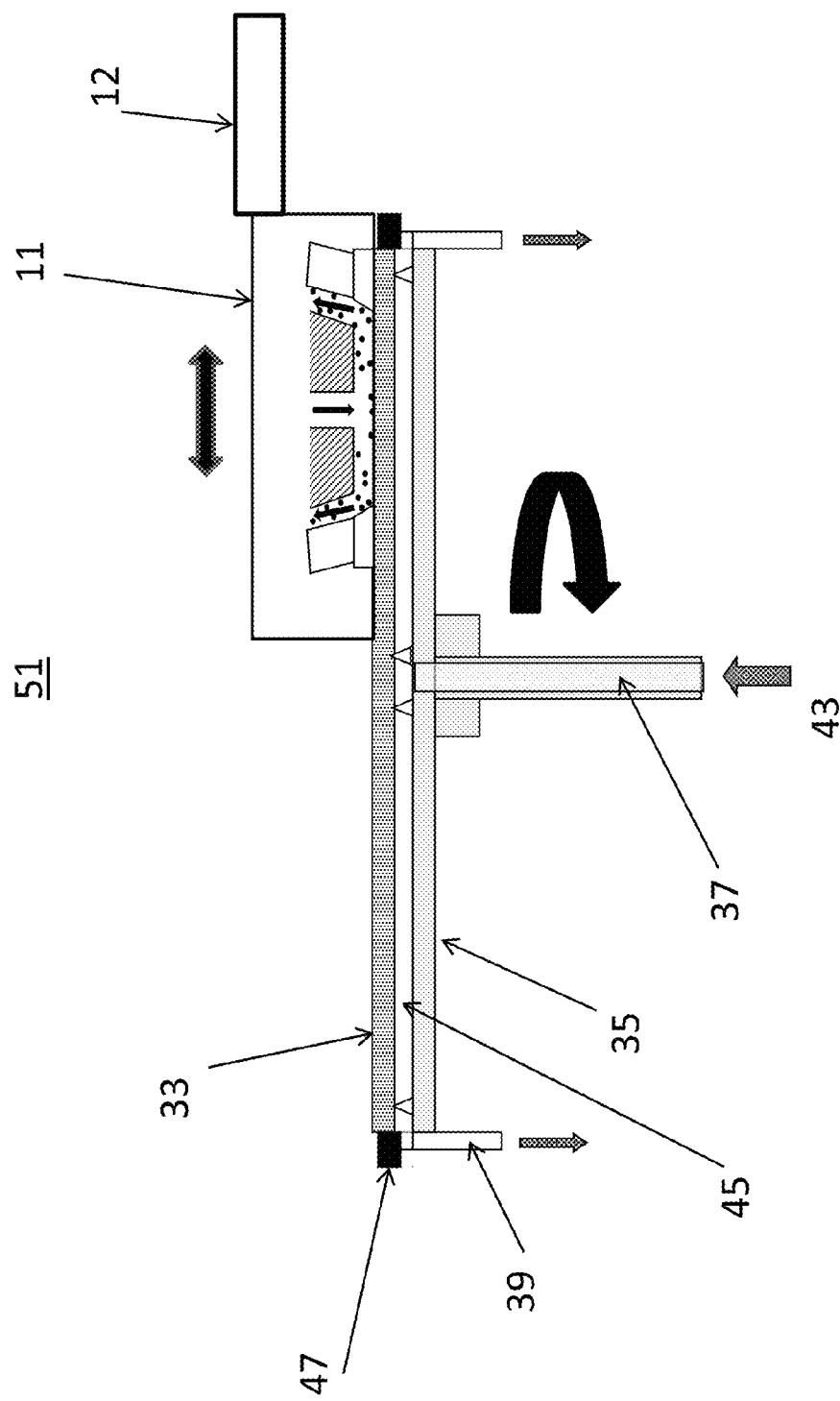
FIG. 3 depicts in a cross-sectional view another embodiment.

FIG. 3 depicts in a cross-sectional view a wafer cleaning station 51 incorporating the embodiments. Movable probe 11 is placed on the surface of the wafer 33 and moves across the wafer surface. Transport mechanism 12 provides the motion mechanically and may include speed control within it to provide an adjustable scan speed. In the embodiment shown here as an illustrative and non-limiting example, the megasonic probe moves rectilinearly across the wafer; and the wafer support 35 rotates the wafer 33 about a central axis. The movable probe 11 may travel all the way across the wafer, or partially across the wafer, for example from the center of the wafer to and from the outside edge. Transport mechanism 12 may be an arm, beam or rail, and may move the movable probe 11 by use of a stepper motor, rotors, worm gears, push rods, cables, hydraulics, spindles and the like. Only the bottom portion of movable megasonic probe 11 contacts the wafer surface, and portions 17 at the bottom opening 23, as shown above. The wafer 33 may be supported at its rim by supports 47 for example; slight vacuum, manual clamping pressure or electrostatic force might be used to secure the wafer 33 to support 35.

In FIG. 3, for this non-limiting example embodiment, an optional wafer backside cleaning system is illustrated. Input port 43 receives fluids for cleaning the backside of the wafer 33. The liquids may be DIW or dAPM, for example. A chamber 45 is formed by the bottom surface of the wafer 33 and a portion of the support 35. The DIW circulates radially outward from the center spindle 37 and exits the support 35 at output ports 39, as indicted by the arrows. In an alternative embodiment, the liquid flow could be reversed. Cleaning the backside in this fashion is considered a water dip or solvent dip, and improves overall particle removal and wafer cleanliness; increasing performance of subsequent process steps. However, in alternative embodiments, wafer support 35 may be provided without the backside cleaning portions.

In operation, the embodiments provide a movable probe that is very adjustable in terms of scan speed and position. In an embodiment, the transport mechanism may be arranged so that the movable probe may move in any x-y direction, or as shown in FIG. 3, the probe may move linearly across the wafer while the wafer rotates. The wafer rotation and probe speed are then adjusted together to form an adjustable scan speed. In an alternative embodiment, contemplated herein and within the scope of the appended claims, the movable megasonic probe may be fixed to a stationary position and the wafer support 35 can provide wafer movement in both rotation and linear directions. The relative scan speed of the movable megasonic probe across the surface of the wafer is what is important. It is not important how the motion is arranged but the movable probe 11 should be able to scan the entire wafer, and the scan speed and position may be adjustable.

Different films that are to be cleaned on the surface of the wafer have different characteristic hardness and durability. In operation, the movable probe 11 is adjusted to have different scan speeds depending on the surface being cleaned and the liquids applied. For more durable surfaces a more thorough cleaning may be used, while for more delicate structures, care must be taken that the movable probe and the released particles not cause damage. By adjusting the scan speed and times for the cleaning, efficient particle removal for different materials is easily accomplished using the embodiments.

Figure 4:
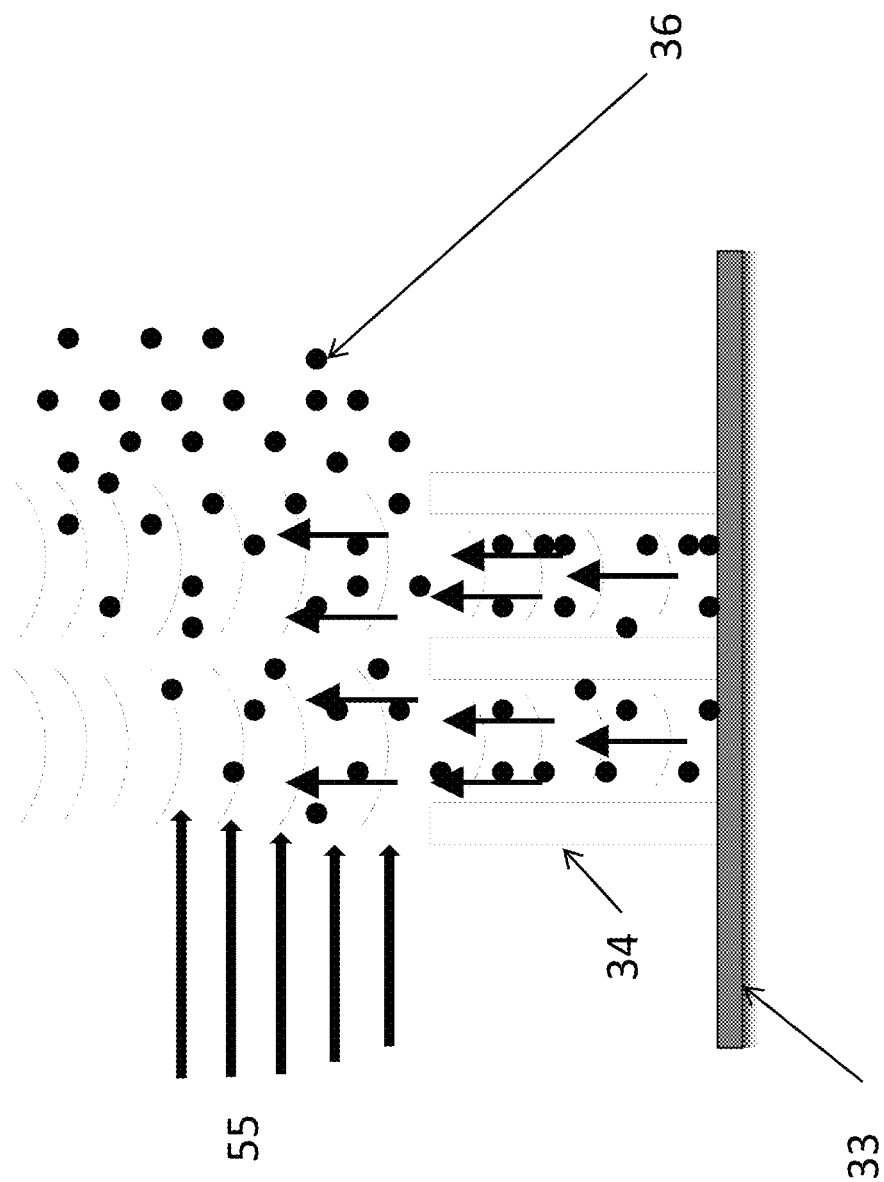
FIG. 4 depicts in a cross-sectional view the operation of an embodiment on a wafer.

The unique design of the movable probe of the embodiments also provides immediate particle removal even as the particles are loosened by the megasonic energy in the fluid. FIG. 4 depicts the cleaning action that occurs during use of the embodiments. Arrows 55 indicate a "drag force" that is parallel to the surface of the substrate, which flows across the pattern 34 as the particles 36 are released by action of the megasonic energy. The drag force is created by the design of megasonic probe 11, which has for example a radial outflow of the liquid from the center of the probe (not shown), flowing across the wafer surface and then being removed immediately away from the wafer. The drag force shown by arrows 55 will move the particles 36 to the exhaust ports in the megasonic probe and carry them directly away from the wafer, so that they will not re-deposit on the wafer.

Figure 5:
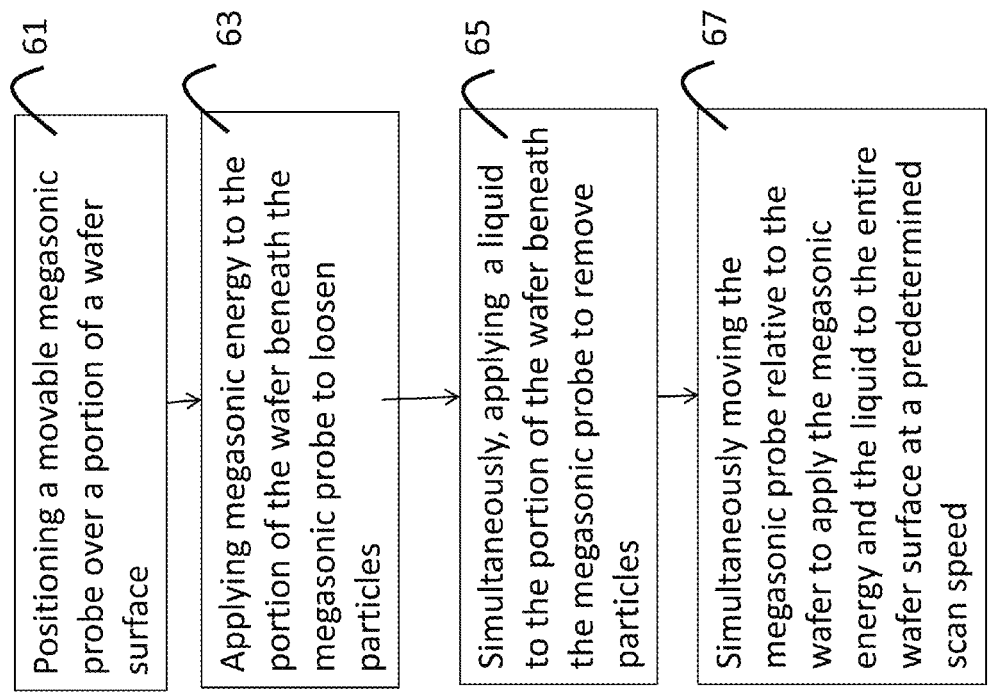
FIG. 5 depicts in a flow diagram a method embodiment.

FIG. 5 depicts a method embodiment in a flow diagram. In state 61, the wafer cleaning process begins by positioning the movable probe over a portion of the wafer surface. As described above the size of the movable probe may vary but typically will cover a portion of the wafer surface. In state 63, megasonic energy is applied to the portion of the wafer surface beneath the megasonic probe, as is known, megasonic energy will loosen particles from the surface. In state 65, the cleaning liquid, which may be, without limitation, DIW, dAPM or SC1, solvents, gas bubbled into liquids, surfactants and the like, is applied to the portion of the wafer beneath the megasonic probe to remove particles and clean the surface. As described above, the liquid flows across the surface and is removed through exhaust ports so that the particles loosened by the megasonic energy are carried away. In state 67 the megasonic probe is moved in a scan pattern relative to the wafer so that the entire wafer surface may be cleaned. Note that the method flow diagram in FIG. 5 presents an example order but these states are performed more or less simultaneously or in any order, and are broken out here only for sake of discussion and simplicity. The megasonic probe simultaneously applies liquid to the wafer surface, and applies megasonic energy to the surface; and moves across it at the same time, either by movement of the megasonic probe, or of the wafer, or both; so that a relative scan speed is established between the wafer and the movable megasonic probe.

In an alternative method embodiment, the megasonic probe described above may be used to apply chemicals other than cleaning chemicals or rinse fluids. For example chemicals that are sometimes applied by spraying could be applied to the wafer surface using the movable probe of the embodiments as an immersion hood. A photoresist strip chemical is one example of such an application. Other chemicals may likewise be applied using the embodiments and these alternatives are contemplated as part of the embodiments and fall within the scope of the appended claims. In such an embodiment, the transducer may not be active, or may not be present if megasonic energy is not required.

In an embodiment, a method includes positioning a movable probe on a wafer surface, the movable probe having an open bottom portion that exposes a portion of the wafer surface; applying a liquid onto the wafer surface through a bottom portion of the movable probe; and moving the movable probe at a predetermined scan speed to traverse the wafer surface, applying the liquid to the wafer surface while moving over the wafer surface. In a further embodiment, a transducer is provided within the movable probe; and while moving the movable probe over the wafer surface, sonic energy is applied to the portion of the wafer surface beneath the bottom portion of the movable probe. In another embodiment, the movable probe has a central portion for applying the liquid to the wafer surface, the liquid flowing across the wafer surface, and the liquid being removed from the wafer surface continuously by exhaust ports in the outer portion of the movable probe. In still another embodiment, applying the liquid further includes applying deionized water. In another method embodiment, applying the liquid further includes applying one of deionized water, ammonia hydroxide-hydrogen peroxide, gas in solution, solvents and surfactants. In yet another embodiment, moving the movable probe further includes moving the movable probe in a linear direction while the wafer is rotated about a central axis. In still another embodiment, moving the movable probe includes moving the wafer in a linear direction while the wafer is rotated and the movable probe remains stationary. In a further alternative embodiment, moving the movable probe includes moving the movable probe in at least two directions while the wafer remains stationary so as to scan the entire wafer. In still another alternate embodiment, the method include supplying a liquid to a backside surface of the wafer opposite the wafer surface, the liquid selected from deionized water, cleaners, solvents, gas in solution, and surfactants. In yet another embodiment, applying the sonic energy includes applying energy with a frequency of between 500 and 1000 kHz. In a further embodiment, applying the sonic energy includes applying energy greater than 500 kHz and less than 20 Mhz.

In an embodiment, an apparatus includes a movable wafer probe, which further includes a transducer disposed within a body forming an immersion hood, the body having sides surrounding the transducer and having an open bottom portion configured to be placed on a wafer surface; a liquid input port for receiving fluids to be applied to a wafer surface at the open bottom portion; and liquid exhaust ports for removing the liquid from the wafer surface through the open bottom portion. In a further embodiment, the transducer has a central opening that forms a part of the liquid input port. In yet another embodiment, the transducer has an outside portion spaced from inner walls of the body, the space between the outside portion of the transducer and the inner walls of the body forming the liquid exhaust ports. In yet another embodiment, the apparatus includes a transport mechanism for moving the movable megasonic probe. In still another embodiment, the transport mechanism moves the movable megasonic probe in a linear fashion. In an alternative embodiment, the transport mechanism moves the movable megasonic probe in at least two directions. In yet another embodiment, the transport mechanism provides an adjustable scan speed for moving the movable megasonic probe.

In still a further method embodiment, a method includes providing a movable probe, the movable probe having a megasonic transducer with a central opening, a liquid input port coupled to the central opening, an open bottom portion configured for applying liquid to a portion of a wafer surface lying beneath the open bottom portion, liquid exhaust ports configured for removing liquid from a portion of a wafer surface, the movable probe having a transport mechanism for moving the movable probe across the wafer surface at a predetermined scan speed; positioning the movable probe on a wafer surface; applying a liquid received at the liquid input port of the movable probe onto a portion of the wafer surface lying beneath the open bottom portion, while simultaneously applying megasonic energy to the portion of the wafer surface. The method continues by removing the liquid from the portion of the wafer surface using the liquid exhaust ports of the movable probe; and moving the movable probe at a predetermined scan speed to traverse the wafer surface, applying the liquid and the megasonic energy to the wafer surface while moving over the wafer surface. During the method particles released by the megasonic energy applied to the wafer surface are carried away from the wafer surface by the liquid through the exhaust ports of the movable probe. In another method embodiment, the above method also includes applying a liquid to a backside of the wafer opposite the wafer surface.

The scope of the present application is not intended to be limited to the particular illustrative embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:
1. A method, comprising:
    positioning a movable probe on a wafer surface, the movable probe having an open bottom portion that exposes a portion of the wafer surface, the movable probe further having a bottom foot portion;
    contacting the wafer surface with the bottom foot portion;
    applying a liquid onto the wafer surface through the open bottom portion of the movable probe while the bottom foot portion is contacting the wafer surface; and
    moving the movable probe at a predetermined scan speed to traverse the wafer surface, applying the liquid to the wafer surface while moving over the wafer surface.

2. The method of claim 1, and further comprising:
providing a transducer within the movable probe; and
while moving the movable probe over the wafer surface, applying sonic energy to the portion of the wafer surface beneath the bottom portion of the movable probe.

3. The method of claim 2 wherein applying the sonic energy comprises applying energy with a frequency of between 500 and 1000 kHz.

4. The method of claim 2 wherein applying the sonic energy comprises applying energy greater than 500 kHz and less than 20 Mhz.

5. The method of claim 2, wherein the portion of the wafer surface closes the open bottom portion when the bottom foot portion contacts the wafer surface.

6. The method of claim 2, wherein the movable probe further comprises an exhaust port disposed adjacent a sidewall of the transducer and a sidewall of the bottom foot portion.

7. The method of claim 1, wherein the movable probe has a central portion for applying the liquid to the wafer surface, the liquid flowing across the wafer surface, and the liquid being removed from the wafer surface continuously by exhaust ports in an outer portion of the movable probe.

8. The method of claim 1, wherein applying the liquid further comprises applying deionized water.

9. The method of claim 1, wherein applying the liquid further comprises applying one selected from the group consisting essentially of deionized water, ammonia hydroxide-hydrogen peroxide, gas in solution, solvents and surfactants.

10. The method of claim 1, wherein moving the movable probe further comprises moving the movable probe in a linear direction while the wafer is rotated about a central axis.

11. The method of claim 1, wherein moving the movable probe comprises moving the wafer in a linear direction while the wafer is rotated and the movable probe remains stationary.

12. The method of claim 1 wherein moving the movable probe comprises moving the movable probe in at least two directions while the wafer remains stationary so as to scan the entire wafer surface.

13. The method of claim 1 and further comprising:
applying a liquid to a backside surface of the wafer opposite the wafer surface, the liquid selected one from the group consisting essentially of deionized water, cleaners, solvents, gas in solution, and surfactants.

14. A method, comprising:
providing a movable probe, the movable probe having a megasonic transducer with a central opening, a liquid input port coupled to the central opening, an open bottom portion configured for applying liquid to a portion of a wafer surface lying beneath the open bottom portion, liquid exhaust ports configured for removing liquid from a portion of a wafer surface, and an immersion hood comprising a bottom foot portion, the movable probe having a transport mechanism for moving the movable probe across the wafer surface at a predetermined scan speed;
positioning the movable probe on a wafer surface, wherein positioning the movable probe comprises contacting the wafer surface with the bottom foot portion;
applying a liquid received at the liquid input port of the movable probe onto a portion of the wafer surface lying beneath the open bottom portion, while simultaneously applying megasonic energy to the portion of the wafer surface and while the bottom foot portion is contacting the wafer surface;
removing the liquid from the portion of the wafer surface using the liquid exhaust ports of the movable probe; and
moving the movable probe at a predetermined scan speed to traverse the wafer surface, applying the liquid and the megasonic energy to the wafer surface while moving over the wafer surface;
wherein particles released by the megasonic energy applied to the wafer surface are carried away from the wafer surface by the liquid through the exhaust ports of the movable probe.

15. The method of claim 14, and further comprising:
applying a liquid to a backside of the wafer opposite the wafer surface.

16. The method of claim 14, wherein the liquid exhaust ports are disposed adjacent sidewalls of the immersion hood and the bottom foot portion.

17. The method of claim 14, wherein the wafer surface closes the immersion hood when the bottom foot portion contacts the wafer surface.

18. A method comprising:
positioning a movable probe over a portion of a wafer surface, the movable probe comprising an immersion hood having a bottom foot portion surrounding an open bottom portion, a transducer in the immersion hood, and an input port;
closing the open bottom portion by contacting the wafer surface with the bottom foot portion;
applying a cleaning solution to the portion of the wafer surface through the input port and the open bottom portion while the bottom foot portion is contacting the wafer;
simultaneously applying megasonic energy; and
moving the movable probe to traverse the wafer surface while applying the cleaning solution and the megasonic energy.

19. The method of claim 18, wherein the movable probe further comprises an exhaust port in a central opening of the transducer, wherein the input port is disposed adjacent a sidewall of the immersion hood, and the method further comprising removing cleaning solution from the open bottom portion through the exhaust port.

20. The method of claim 18, wherein the movable probe further comprises an exhaust port disposed adjacent a sidewall of the immersion hood, wherein the input port is disposed in a central opening of the transducer, and the method further comprising removing cleaning solution from the open bottom portion through the exhaust port.

* * * * *